United States Patent
Koga et al.

(10) Patent No.: US 6,870,372 B2
(45) Date of Patent: Mar. 22, 2005

(54) ABNORMALITY DETECTION APPARATUS OF COMPARATOR

(75) Inventors: Osamu Koga, Tokyo (JP); Koji Uno, Tokyo (JP); Yasuharu Kawamura, Tokyo (JP)

(73) Assignee: Niles Parts Co., Ltd. (JP)

( * ) Notice: Subject to any disclaimer, the term of this patent is extended or adjusted under 35 U.S.C. 154(b) by 0 days.

(21) Appl. No.: 10/372,321

(22) Filed: Feb. 25, 2003

(65) Prior Publication Data

US 2004/0164744 A1 Aug. 26, 2004

(30) Foreign Application Priority Data

Feb. 27, 2002 (JP) ........................................ 2002-051527

(51) Int. Cl.[7] .................... G01R 31/00; H03M 13/00
(52) U.S. Cl. ........................ 324/500; 714/819
(58) Field of Search ................. 714/736, 799, 714/812, 1, 21, 30, 819, 824; 340/652, 653, 520, 146.2; 324/555, 537, 500; 330/69; 702/121; 73/54.29; 33/501.05

(56) References Cited

U.S. PATENT DOCUMENTS

| | | | | | |
|---|---|---|---|---|---|
| 4,001,818 A | * | 1/1977 | Radichel et al. | ............ | 340/520 |
| 4,328,583 A | * | 5/1982 | Stodola | ...................... | 714/812 |
| 5,789,925 A | * | 8/1998 | Yokotani et al. | ............ | 324/500 |

* cited by examiner

*Primary Examiner*—N. Le
*Assistant Examiner*—Hoai-An D. Nguyen
(74) *Attorney, Agent, or Firm*—Rader, Fishman & Grauer PLLC

(57) ABSTRACT

Abnormality of a comparator is to be detected while it is assembled in a control apparatus. An output OUT of a comparator 4 is connected to a first analog data input port 13 in addition to an input port 11 of a microcomputer 6. A pin P1 as a signal input terminal of the comparator is connected to a second output port 15 capable of outputting an H or L microcomputer signal MO of the microcomputer and also to a second analog data input port 14. An abnormality judgment portion 9 of the microcomputer can detect abnormality due to failure of the comparator itself and failure of the peripheral devices on the basis of the output of the comparator during a normal operation, the comparator output when the microcomputer signal is outputted, and the comparator outputs before and after the output and stop of the microcomputer signal.

2 Claims, 4 Drawing Sheets

FIG. 2

| FAILURE PORTION | | FAILURE MODE | INFLUENCE OF FAILURE | DETECTION CODE |
|---|---|---|---|---|
| PERIPHERAL DEVICE 1 | | Open | COMPARATOR OUTPUT IS FIXED TO H | ② |
| | | Short | NO INFLUENCE | — |
| PERIPHERAL DEVICE 2 | | Open | COMPDRATOR OUTPUT IS FIXED | ③ |
| | | Short | HYSTRESIS DECREASES | ④ |
| PERIPHERAL DEVICE 3 | | Open | HYSTRESIS DECREASES | ④ |
| | | Short | COMPARATOR OUTPUT IS FIXED | ③ |
| COMPARATOR | P1 (IN+) | Open | COMPARATOR OUTPUT IS FIXED TO L | ② |
| | | VccShort | COMPARATOR OUTPUT IS FIXED TO H | ② |
| | | GNDShort | COMPARATOR OUTPUT IS FIXED TO L | ② |
| | | P2Short | COMPARATOR OUTPUT IS FIXED TO L | ② |
| | P1 (IN-) | Open | COMPARATOR OUTPUT IS FIXED TO H | ② |
| | | VccShort | COMPARATOR OUTPUT IS FIXED TO L | ② |
| | | GNDShort | COMPARATOR OUTPUT IS FIXED TO H | ② |
| | | P4SHort | COMPARATOR OUTPUT IS FIXED TO L | ② |
| | P3 (OUT) | Open | COMPARATOR OUTPUT IS FIXED TO INTERMEDIATE POTENTIAL | ① |
| | | VccShort | COMPARATOR OUTPUT IS FIXED TO H | ② |
| | | GNDShort | COMPARATOR OUTPUT IS FIXED TO L | ② |
| | | P5Short | COMPARATOR OUTPUT IS FIXED TO H | ② |
| | P4 (Vcc) | Open | COMPARATOR OUTPUT IS FIXED TO INTERMEDIATE POTENTIAL | ① |
| | | VccShort | NO INFLUENCE | — |
| | | GNDShort | SUPPLY OF Vcc POWER SOURCE IS NOT POSSIBLE | ⑤ |
| | | P1Short | COMPARATOR OUTPUT IS FIXED TO H | ② |
| | P5 (GND) | Open | COMPARATOR OUTPUT CAN BE LOWERED ONLY TO INTERMEDIATE POTENTIAL | ① |
| | | VccShort | SUPPLY OF Vcc POWER SOURCE IS NOT POSSIBLE | ⑤ |
| | | GNDShort | NO INFLUENCE | — |
| | | P3Short | COMPARATOR OUTPUT IS FIXED TO H | ② |

FIG. 3

| DETECTION METHOD |
|---|
| ① CONFIRMATION OF OUT VOLTAGE:<br>• OUT VOLTAGE≧4.75V OR OUT VOLTAGE≦0.5V ⟶NORMAL<br>• 0.5V<OUT VOLTAGE<4.75V ⟶ABNORMAL |
| ② CONFIRMATION OF MO LEVEL AND OUT VOLTAGE:<br>• MO=H, OUT≧4.75V OR MO=L, OUT≦0.5V ⟶ NORMAL<br>• MO=H, OUT<4.75V OR MO=L, OUT>0.5V ⟶ ABNORMAL |
| ③ CONFIRMATION OF OUT LEVEL BEFORE AND AFTER COMPARATOR DIAGNOSIS:<br>• NO DIFFERENCE BEFORE AND AFTER DIAGNOSIS ⟶NORMAL<br>• DIFFERENCE EXISTS BEFORE AND AFTER DIAGNOSIS ⟶ABNORMAL |
| ④ CONFIRMATION OF IN+ VOLTAGE FOR EACH CHANGE OF OUT LEVEL:<br>• DIFFERENCE OF IN+ VOLTAGE VALUES OF PREVIOUS TIME AND THIS TIME ≦ PREDETERMINED VALUE ⟶NORMAL<br>• DIFFERENCE OF IN+ VOLTAGE VALUES OF PREVIOUS TIME AND THIS TIME > PREDETERMINED VALUE ⟶ABNORMAL |
| ⑤ CONFIRMATION OF OUT LEVEL:<br>• MO=H, OUT=H OR MO=L, OUT=L ⟶NORMAL<br>• MO=H, OUT=L OR MO=L, OUT=H ⟶ABNORMAL |

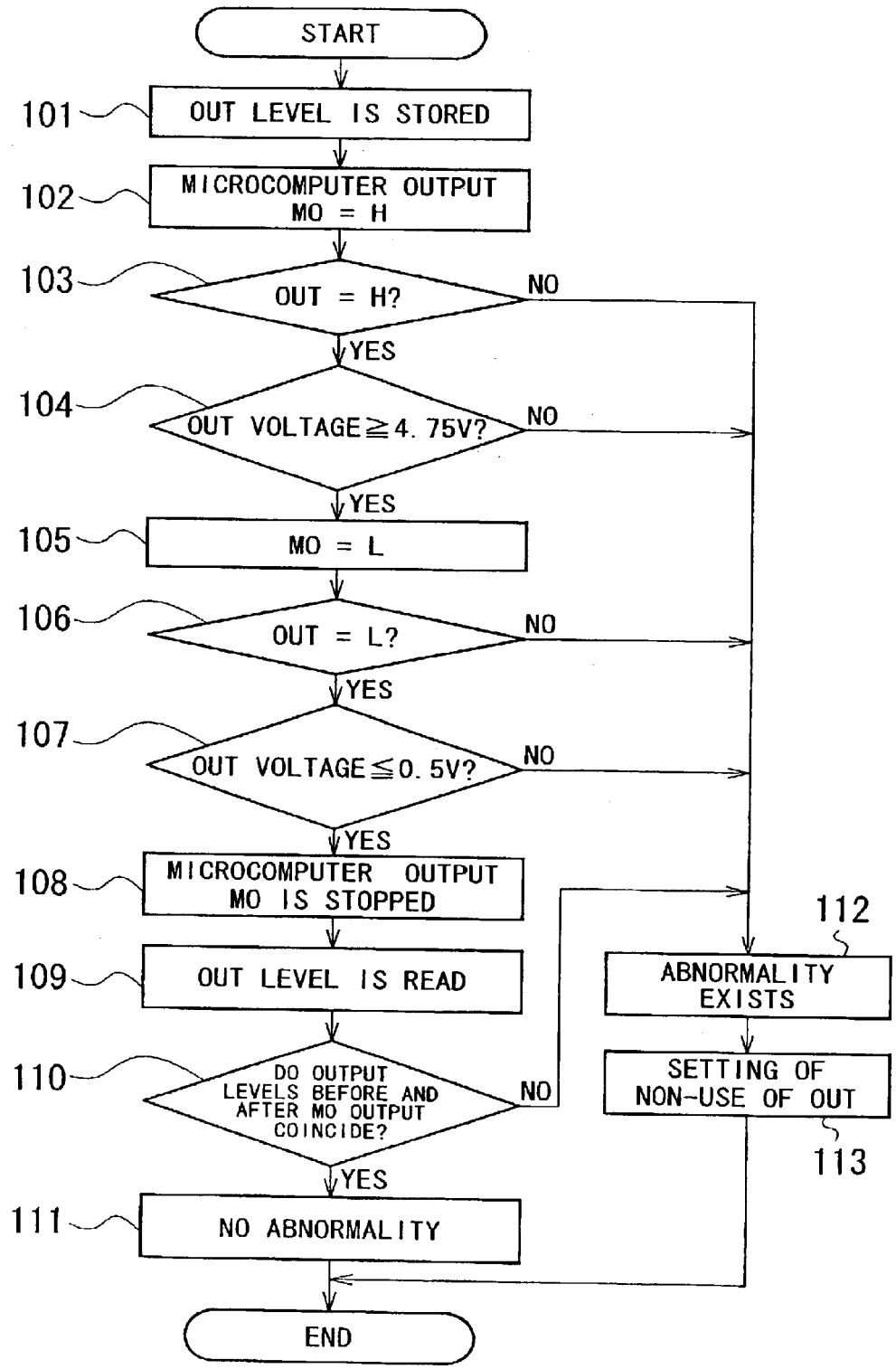

ABNORMALITY DETECTION APPARATUS OF COMPARATOR

BACKGROUND OF THE INVENTION

1. Field of the Invention

This invention relates to an abnormality detection apparatus of a comparator in a control circuit equipped with a microcomputer.

2. Description of Related Art

A comparator has been widely used in various input systems to a microcomputer in a control circuit equipped with the microcomputer. For example, the comparator compares voltages of signals from an input circuit that are inputted to two input terminals, and sends a comparison result as an H or L level output from an output terminal to an input port of the microcomputer.

Such a comparator includes a large number of terminal pins at its input/output terminals in addition to terminals of a driving power source system, and involves the possibility of open-circuit failure or short-circuit failure between the comparator main body and the terminal pin and failure in peripheral devices. Such failure in and around the comparator becomes an error input to the microcomputer and hinders normal control.

It is therefore necessary to confirm whether or not circuits in and around the comparator normally operate. Though a technology has been practiced in the past that takes out the comparator single body and confirms its basic operation, it has been difficult to confirm the comparator operation under the state where the comparator is used inside the control apparatus. When hysteresis is imparted to the comparator, means has not been available for detecting failure of the peripheral devices for imparting hysteresis.

SUMMARY OF THE INVENTION

In view of the problems described above, the invention aims at providing an abnormality detection apparatus of a comparator that can easily detect failure of the comparator while it is connected to a microcomputer of a control apparatus, and further an abnormality detection apparatus that can detect abnormality resulting from failure of peripheral devices in the case where they are used to impart hysteresis.

To accomplish the object, a first aspect according to the invention is that in which a comparator including an output terminal thereof connected to an input port of a microcomputer, wherein the output terminal of the comparator is further connected to a first analog data input port of the microcomputer, and the microcomputer includes an abnormality judgment portion for judging existence/absence of abnormality of the comparator on the basis of an output voltage of the comparator.

A second aspect according to the invention is that in which a signal input terminal of the comparator is further connected to an output port of the microcomputer capable of outputting a microcomputer signal of an H level or an L level relative to a reference voltage of the comparator, and the abnormality judgment portion judges existence/absence of abnormality of the comparator on the basis of an output level corresponding to the microcomputer signal and an output voltage of the comparator.

A third aspect according to the invention is that in which, in a comparator equipped with peripheral devices for imparting hysteresis and having an output terminal thereof connected to an input port of a microcomputer, an output terminal of the comparator is further connected to a first analog data input port of the microcomputer, a signal input terminal of the comparator is further connected to an output port of the microcomputer capable of outputting a microcomputer signal of an H level or an L level relative to a reference voltage of the comparator and also to a second analog data input port, and the microcomputer includes an abnormality judgment portion for judging existence/absence of abnormality of a comparator circuit inclusive of the peripheral devices on the basis of an output level corresponding to the microcomputer signal and an output voltage of the comparator and an input voltage of the comparator.

BRIEF DESCRIPTION OF THE DRAWINGS

FIG. 2 shows failure modes and their influences;

FIG. 3 shows a failure detection method; and

FIG. 4 is a flowchart that shows a flow of a diagnosis process.

DESCRIPTION OF PREFERRED EMBODIMENTS

Figure 1:
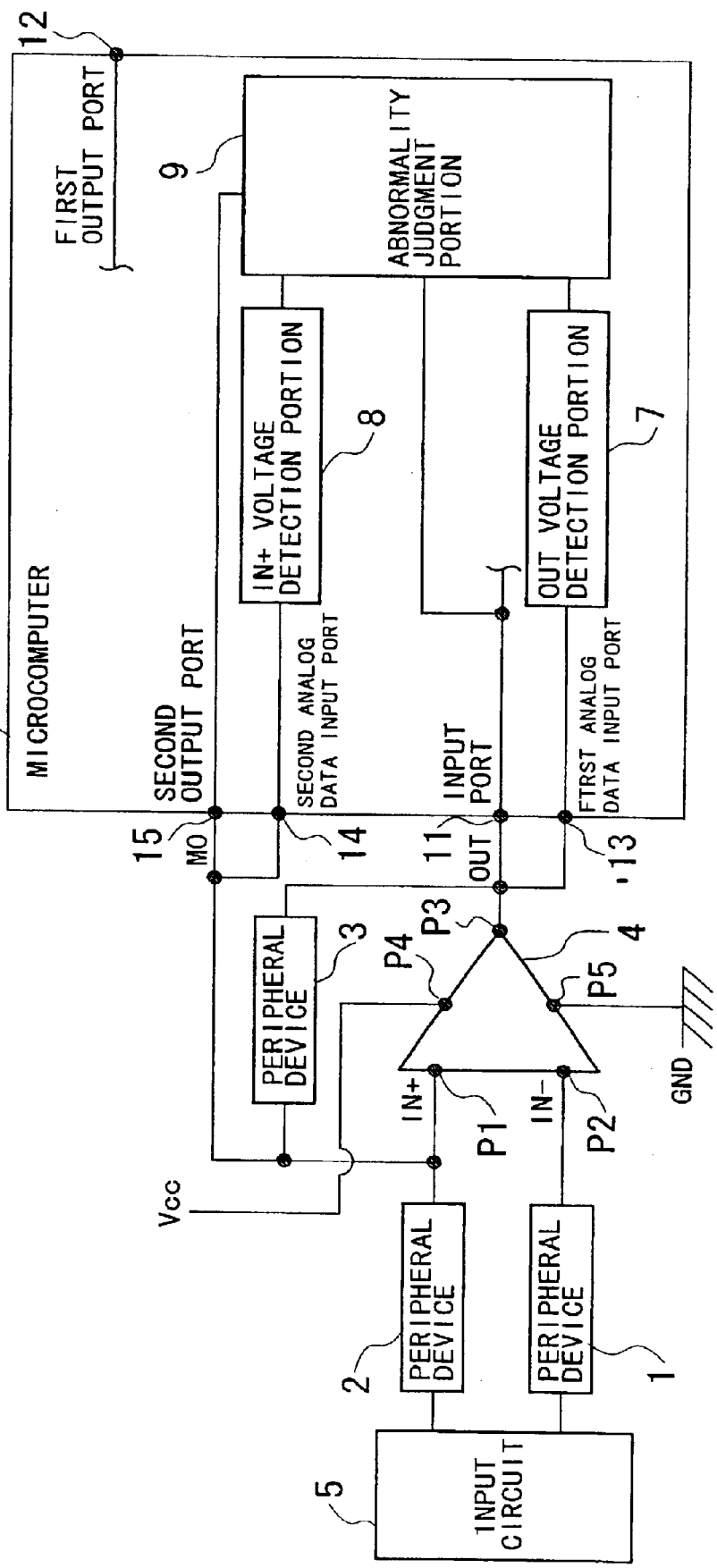
FIG. 1 shows an embodiment of the invention.

An embodiment of the invention will be hereinafter explained.

FIG. 1 shows a construction of the embodiment.

A comparator circuit including a comparator 4 and peripheral devices 1 to 3 is interposed between an input circuit 5 and a microcomputer 6.

The comparator 4 has its pin P4 connected to a power source Vcc and its pin 5 connected to GND (ground) as its driving power source system. The comparator 4 includes a pin P1 of a non-inversion input and a pin P2 of an inversion input as its signal input terminals, and a pin P3 as an output terminal.

The pin P1 is connected to the input circuit 5 through the peripheral device 2 and the pin P2 is connected to the input circuit 5 through the peripheral device 1. The pin P3 is connected to an input port 11 of a microcomputer 6.

The input circuit 5 outputs reference potential, for example, to the pin P2 and a control signal the potential of which changes to the pin P1. It will be hereby assumed that the input to the pin P1 is IN+, the input to the pin P2 is IN– and the output from the pin P3 is OUT.

The peripheral device 3 is connected between the pin P3 and the pin P1. Each of the peripheral devices 1, 2 and 3 is a resistor, for example, and the peripheral devices 2 and 3 decide predetermined hysteresis. The peripheral device 1 is for matching impedance of an input path to the pin P2 with impedance of an input path of the pin P1 in which the peripheral device 2 is disposed.

The microcomputer 6 executes a logical process in accordance with a level (H/L) of the comparator output OUT applied to its input port 11 during a normal operation, and outputs a control signal from a first output port 12 to an external apparatus not shown in the drawing.

In this embodiment, the pin P3 of the comparator 4 is connected to a first analog data (AD) input port 13 of the microcomputer 6. The pin P1 is connected to a second output port 15 of the microcomputer 6 and to a second analog data input port 14.

The microcomputer 6 includes an OUT voltage detection portion 7 for detecting a voltage of the first analog data input port 13 (that is, the voltage of the comparator output OUT), an IN+ voltage detection portion 8 for detecting a voltage of the second analog data input port 14 (that is, the voltage of the comparator input IN+) and an abnormality judgment portion 9 to which the OUT voltage detection portion 7 and the IN+ voltage detection portion 8 are connected.

The abnormality judgment portion 9 is further connected to the input port 11 and to a second output port 15.

The abnormality judgment portion 9 normally keeps the second output port 15 open to achieve high impedance and changes the output of the second output port 15 (hereinafter called "microcomputer output") MO to the H and L levels only at the time of predetermined diagnosis. Whether or not the function of the comparator 4 inclusive of the peripheral devices 1 to 3 is normal or abnormal is judged by detecting the state of each input port 11, 13, 14 through the OUT voltage detection portion 7, the IN+ voltage detection portion 8, etc, and by detecting normally the voltage of the pin P1 when the output level of the comparator 4 changes, through the IN+ voltage detection portion 8.

The OUT voltage detection portion 7, the IN+ voltage detection portion 8 and the failure judgment portion 9 are constituted by software.

FIG. 2 shows failure modes that may occur in and around the comparator, and their influences.

When the peripheral device 1 undergoes open (Open) failure due to disconnection, the comparator output OUT is fixed to H irrespective of the voltage value of the comparator input IN+. On the other hand, when the peripheral device 1 is short-circuited (Short), no influence is exerted.

When the peripheral device 2 undergoes open failure, the comparator output OUT is fixed. When the peripheral device 1 is short-circuited (Short), hysteresis decreases.

When the peripheral device 3 undergoes open failure, hysteresis decreases. When the peripheral device 3 is short-circuited, the comparator output OUT is fixed.

As to the comparator 4 per se, the comparator output OUT is fixed to L when the pin P1 related with the comparator input IN+ undergoes open failure.

When the pin P1 is short-circuited to the power source Vcc (Vcc Short), the comparator output OUT is fixed to H. When the pin P1 is short-circuited to GND (GND Short), the comparator output OUT is fixed to L.

When the pin P1 is short-circuited to the adjacent pin P2 (P2 Short), the comparator output OUT is fixed to L, too.

When the pin P2 related with the comparator input IN- undergoes open failure, the comparator output OUT is fixed to H.

When the pin P2 is short-circuited to the power source Vcc, the comparator output OUT is fixed to L.

When the pin P2 is short-circuited to GND, the comparator output OUT is fixed to H.

When the pin P2 is short-circuited to the pin P4 (P4 Short), the comparator output OUT is fixed to L, too.

When the pin P3 related with the comparator output OUT undergoes open failure, the comparator output OUT is fixed to an intermediate potential.

When the pin P3 is short-circuited to the power source Vcc, the comparator output OUT is fixed to H.

When the pin P3 is short-circuited to GND, the comparator output OUT is fixed to L.

When the pin P3 is short-circuited to the pin P5 (P5 Short), the comparator output OUT is fixed to H.

When the pin P4 connected to the power source Vcc undergoes open failure, the comparator output OUT is fixed to an intermediate potential.

On the other hand, when the pin P4 is short-circuited to the power source Vcc, no influence is exerted at all.

When the pin P4 is short-circuited to GND, supply of the power source becomes impossible.

When the pin P4 is short-circuited to the pin P1 (P1 Short), the comparator output OUT is fixed to H.

When the pin P5 connected to GND undergoes open failure, the comparator output OUT drops only to the intermediate potential.

When the pin P5 is short-circuited to the power source Vcc, supply of the power source becomes impossible.

When the pin P5 is short-circuited to GND, no influence is exerted at all.

When the pin P5 is short-circuited to the pin P3 (P3 Short), the comparator output OUT is fixed to H.

The influences of the failures described above are divided into several types, and can be classified as the detection codes in the following way:

Detection Code ①:
Comparator output OUT stops at intermediate potential.
Detection Code ②:
Comparator output OUT is fixed to H or L.
Detection Code ③:
Even when comparator output OUT once changes due to change of comparator input, it is thereafter fixed.
Detection Code ④:
Hysteresis changes.
Detection Code ⑤:
Supply of power source becomes impossible.

The abnormality judgment portion 9 of the microcomputer 6 confirms the existence/absence of each of these detection codes as shown in FIG. 3 to judge normality/abnormality.

In other words, as to the detection code ①, the voltage of the comparator output OUT is checked, and the comparator is judged as normal when the OUT voltage is higher than 4.75 V or lower than 0.5 V, and as being failed when the OUT voltage is higher than 0.5 V and lower than 4.75 V.

As to the detection code ②, the level of the output of the second output port 15 (microcomputer output) MO is changed, and the voltage of the comparator output OUT is checked.

The comparator is judged as normal when the microcomputer output MO is H and the OUT voltage is higher than 4.75 V, or when the microcomputer output MO is L and the OUT voltage is lower than 0.5 V. The comparator is judged as being failed when the microcomputer output MO is H and the OUT voltage is lower than 4.75 V, or when the microcomputer output MO is L and the OUT voltage is higher than 0.5 V.

As to the detection code ③, the levels of the comparator outputs OUT before and after the comparator diagnosis interposing the output of the microcomputer output MO is checked.

The comparator is judged as normal if no difference exists in the level (H or L) of the comparator output OUT before the microcomputer output MO is outputted to the second output port 15 and after the H or L microcomputer output MO is outputted and then the second output port 15 is again opened. The comparator is judged as being failed if such a difference exists.

As to the detection code ④, the voltage value of the comparator input IN+ is checked for each level change of the comparator output OUT.

The comparator is judged as normal when the difference between the IN+ voltage value of the comparator input when the level of the comparator output OUT changes from H to L and the IN+ voltage value when the level of OUT subsequently changes from L to H remains within a predetermined value. When the difference of both voltage values is greater than the predetermined value, hysteresis has changed, and comparator is judged being failed.

Incidentally, the change sequence between H and L of the level of the comparator output OUT may be H to L, or vice versa.

As to the detection code ⑤, the microcomputer output MO is changed to check the level of the comparator output OUT.

The comparator is judged as normal when the microcomputer output MO is H and the comparator output OUT is H, or when the microcomputer output MO is L and the comparator output OUT is L, and as being failed when the microcomputer output MO is H and the comparator output OUT is L or when the microcomputer output MO is L and the comparator output OUT is H.

Among the judgment standards described above, confirmation of the detection code ① and the detection code ④ is executed by detecting the OUT voltage and the IN+ voltage value in an arbitrary interval while the ordinary use state of the comparator 6 is maintained.

Confirmation of the detection code ②, the detection code ③ and the detection code ⑤ is executed by outputting the microcomputer output MO from the abnormality judgment portion 9 to the second output port 15 by an interrupt process.

FIG. 4 is a flowchart showing an example of the flow of the diagnosis process in the microcomputer 6 for the detection code ②, the detection code ③ and the detection code ⑤.

When an interrupt command of the start of diagnosis is given, the failure judgment portion 9 first stores the level (H or L) of the comparator output OUT inputted to the input port 11 in Step 101.

In subsequent Step 102, the abnormality judgment portion 9 outputs the microcomputer output MO of the H level to the second output port 15 and checks in Step 103 whether or not the comparator output OUT inputted to the input port 11 is H.

When the comparator output OUT is H, the flow proceeds to Step 104. The voltage value of the comparator output OUT is read from the OUT voltage detection portion 7, and whether or not the OUT voltage is higher than 4.75 V is checked.

When the OUT voltage is higher than 4.75 V, the microcomputer output MO to the second output port 15 is set this time to L in Step 105. In Step 106, whether or not the comparator output OUT is L is checked.

When the comparator output OUT is L, the flow proceeds to Step 107, and whether or not the OUT voltage is lower than 0.5 V is checked. When the OUT voltage is lower than 0.5 V, the flow proceeds to Step 108.

In Step 108, the second output port 15 is opened, and the output of the microcomputer MO is stopped.

In Step 109, the level of the comparator output OUT at the input port 11 is read. In Step 110, whether or not the level of the comparator output OUT before outputting of the microcomputer output MO, that is stored in the preceding Step 101, is coincident with the level of the comparator output OUT after the stop of the microcomputer output MO read in the preceding Step is checked.

When the levels of the comparator outputs OUT before and after outputting of the microcomputer output MO are the same, the comparator is judged as "normal" in Step 111 and the diagnosis is completed.

On the other hand, when the comparator output OUT is not H by the check in Step 103, when the OUT voltage is not higher than 4.75 V by the check in Step 104, when the comparator output OUT is not L by the check in Step 106, when the OUT voltage is not lower than 0.5 V by the check in Step 107 or when the levels of both comparator outputs OUT do not coincide by the check in Step 110, the comparator is judged as "being failed" in Step 112 and a report of failure is outputted to outside, whenever necessary. At the same time, internal setting is changed in Step 113 lest this comparator output OUT is used for the logical process inside the computer. The diagnosis is then completed.

Steps 101, 109 and 110 in the flow described above constitute failure detection about the detection code ③, Steps 102, 103, 105 and 106 constitute failure detection about the detection code ⑤, and Steps 102, 104, 105 and 107 constitute failure detection about the detection code ②.

When the comparator is judged as "being failed" in the diagnosis about other detection code ① and detection code ④, too, report of failure is similarly outputted to outside and internal setting is changed lest the comparator output OUT is used for the logical process inside the microcomputer.

The embodiment has the construction described above. In the comparator circuit inclusive of the peripheral devices for deciding hysteresis, the pin P3 of the comparator 4 is connected to the first analog data input port 13 of the microcomputer 6 and the pin P1 is connected to the second output port 15 and the second analog data input port 14 of the microcomputer 6 so that the voltage of the comparator output OUT and the voltage of the comparator input IN+ can be detected and the microcomputer output MO can be inputted to the comparator. Therefore, failure of the comparator 4 inclusive of failure of the intermediate potential and abnormality of the comparator circuit resulting from failure of the peripheral devices can be detected while the comparator circuit is kept assembled in the control apparatus.

As described above, in the invention, the output terminal of the comparator is connected to the first analog data input port in addition to the ordinary input port of the microcomputer, and the abnormality judgment portion provided to the microcomputer judges the existence/absence of abnormality of the comparator on the basis of the output voltage of the comparator. It is therefore possible to detect, for example, abnormality resulting from failure of the terminals of the power source system of the comparator or failure of the output terminal by detecting the state where the output voltage remains at the intermediate potential.

The signal input terminal of the comparator is further connected to the output port of the microcomputer that can output the H level or L level microcomputer signal relative to the reference voltage of the comparator. Consequently, abnormality resulting from open-circuit failure and short-circuit failure of each terminal of the comparator can also be detected by detecting the state where the comparator output is fixed at H or L when the microcomputer signal is outputted. Particularly, abnormality brought forth by failure of the supply of the power source resulting from short-circuit between the power source system terminals of the comparator can be detected by detecting the state where the comparator output does not correspond to H or L of the microcomputer signal when the microcomputer signal is outputted.

When the peripheral devices are additionally provided so as to impart hysteresis to the comparator, the output terminal of the comparator is connected also to the first analog data input port besides the ordinary input port of the microcomputer, and the signal input terminal of the comparator is connected to the output port of the microcomputer capable of outputting the H or L microcomputer signal relative to the reference voltage of the comparator and further to the second analog data input port. Therefore, abnormality resulting from failure of the peripheral devices can be detected, in addition to each of the failures described above, by detecting the change of hysteresis for each level change of the comparator output or by detecting the state where H or L of the comparator outputs before and after the stop of the output of the microcomputer signal do not coincide but are fixed at the opposite levels.

What is claimed is:

1. An abnormality detection apparatus for a comparator comprising:

an output terminal connected to an input port of a microcomputer, wherein said output terminal of said comparator is further connected to a first analog data input port of said microcomputer, and said microcomputer includes an abnormality judgment portion for judging existence/absence of abnormality of said comparator based on an output voltage of said comparator wherein a signal input terminal of said comparator is further connected to an output port of said microcomputer that is capable of outputting an H level or an L level microcomputer signal relative to a reference voltage of said comparator, and said abnormality judgment portion judges existence/absence of abnormality of said comparator based on an output level corresponding to said microcomputer signal and an output voltage of said comparator.

2. An abnormality detection apparatus for a comparator comprising:

peripheral devices for imparting hysteresis; and an output terminal thereof connected to an input port of a microcomputer, wherein said output terminal of said comparator is further connected to a first analog data input port of said microcomputer, a signal input terminal of said comparator is connected to an output port of said microcomputer, wherein said microcomputer is capable of outputting an H level or an L level microcomputer signal relative to a reference voltage of said comparator and to a second analog data input port, and said microcomputer includes an abnormality judgment portion for judging existence/absence of abnormality of a comparator circuit included in each of said peripheral devices based on an output level corresponding to said microcomputer signal, an output voltage of said comparator, and an input voltage of said comparator.

* * * * *